US010229891B2

(12) United States Patent
Scharf et al.

(10) Patent No.: US 10,229,891 B2
(45) Date of Patent: Mar. 12, 2019

(54) CHIP EMBEDDING PACKAGE WITH SOLDERABLE ELECTRIC CONTACT

(71) Applicant: Infineon Technologies AG, Neubiberg (DE)

(72) Inventors: Thorsten Scharf, Regensburg (DE); Steffen Jordan, Viehhausen (DE); Wolfgang Schober, Amberg (DE); Thomas Ziegler, Kelheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/436,778

(22) Filed: Feb. 18, 2017

(65) Prior Publication Data

US 2017/0250152 A1   Aug. 31, 2017

(30) Foreign Application Priority Data

Feb. 29, 2016   (DE) .................. 10 2016 103 585

(51) Int. Cl.
*H01L 23/31* (2006.01)
*H01L 21/56* (2006.01)
(Continued)

(52) U.S. Cl.
CPC ............ *H01L 24/08* (2013.01); *H01L 21/561* (2013.01); *H01L 21/78* (2013.01);
(Continued)

(58) Field of Classification Search
CPC ......... H01L 24/01–24/33; H01L 24/80–24/82; H01L 2021/60007–2021/60262; H01L 2224/80801–2224/8083; H01L 2224/81801–2224/8182; H01L 2224/82801–2224/8282; H01L 2224/858–2224/85815; H01L 23/492; H01L 21/288–21/2885; H01L 21/445; H01L 51/0006; C25F 3/16; C25F 3/22
See application file for complete search history.

(56) References Cited

U.S. PATENT DOCUMENTS 5,484,688 A * 1/1996 Horn .................. G03F 7/40
427/282
7,478,741 B1 * 1/2009 Newman ............... B23K 31/12
228/102

(Continued)

FOREIGN PATENT DOCUMENTS

| CN | 1886828 A | 12/2006 |
| DE | 102011105354 A1 | 12/2011 |
| DE | 102013110006 A1 | 3/2014 |

OTHER PUBLICATIONS

Electrochemical Migration on Electronic Chip Resistors in Chloride Environments; Publication: Sep. 3, 2009; Author: Daniel Minzari.

(Continued)

*Primary Examiner* — Maliheh Malek

(57) ABSTRACT

A package comprising an electronic chip, a laminate-type encapsulant at least partially encapsulating the electronic chip, a wiring structure extending from the electronic chip up to a contact pad, and a completely galvanically formed solderable exterior electric contact electrically coupled with the electronic chip by being arranged on the contact pad.

22 Claims, 3 Drawing Sheets

(51) Int. Cl.
*H01L 21/78* (2006.01)
*H01L 23/00* (2006.01)
*H01L 25/065* (2006.01)
*H01L 25/00* (2006.01)
*H01L 23/538* (2006.01)
*H01L 23/498* (2006.01)

(52) U.S. Cl.
CPC ...... *H01L 23/3157* (2013.01); *H01L 23/5383* (2013.01); *H01L 23/5386* (2013.01); *H01L 24/03* (2013.01); *H01L 24/06* (2013.01); *H01L 24/17* (2013.01); *H01L 24/43* (2013.01); *H01L 24/45* (2013.01); *H01L 24/83* (2013.01); *H01L 25/0652* (2013.01); *H01L 25/50* (2013.01); *H01L 23/3128* (2013.01); *H01L 23/49827* (2013.01); *H01L 2224/0401* (2013.01); *H01L 2224/04042* (2013.01); *H01L 2224/05111* (2013.01); *H01L 2224/05116* (2013.01); *H01L 2224/05139* (2013.01); *H01L 2224/05144* (2013.01); *H01L 2224/05155* (2013.01); *H01L 2224/18* (2013.01); *H01L 2924/01015* (2013.01)

(56) References Cited

U.S. PATENT DOCUMENTS

| | | | | |
|---|---|---|---|---|
| 8,318,596 | B2 | 11/2012 | Kuo et al. | |
| 9,093,459 | B2* | 7/2015 | Chou | H01L 21/568 |
| 9,331,023 | B1* | 5/2016 | Liu | H01L 24/13 |
| 9,524,940 | B2* | 12/2016 | Fischer | H01L 21/7685 |
| 9,704,843 | B2* | 7/2017 | Kilger | H01L 25/50 |
| 9,859,251 | B2* | 1/2018 | Beer | H01L 25/0657 |
| 9,978,720 | B2* | 5/2018 | Theuss | H01L 24/97 |
| 2005/0253263 | A1* | 11/2005 | Sugimoto | H01L 21/4846 |
| | | | | 257/737 |
| 2006/0267157 | A1* | 11/2006 | Edwards | H01L 21/4846 |
| | | | | 257/646 |
| 2008/0078813 | A1* | 4/2008 | Hwang | H01L 23/49816 |
| | | | | 228/101 |
| 2008/0079461 | A1* | 4/2008 | Lin | H01L 21/76816 |
| | | | | 326/80 |
| 2008/0173470 | A1 | 7/2008 | Barbetta | |
| 2008/0290511 | A1* | 11/2008 | Van Veen | H01L 23/5389 |
| | | | | 257/737 |
| 2009/0065912 | A1* | 3/2009 | Riedl | C25D 3/56 |
| | | | | 257/666 |
| 2009/0108423 | A1* | 4/2009 | Riedl | H01L 23/3107 |
| | | | | 257/675 |
| 2009/0127702 | A1* | 5/2009 | Dekker | H01L 21/486 |
| | | | | 257/713 |
| 2009/0162622 | A1* | 6/2009 | Van Veen | B23K 35/0222 |
| | | | | 428/198 |
| 2009/0243098 | A1* | 10/2009 | Farooq | H01L 24/11 |
| | | | | 257/738 |
| 2010/0013106 | A1* | 1/2010 | Otremba | H01L 21/561 |
| | | | | 257/777 |
| 2010/0052148 | A1* | 3/2010 | Hsu | H01L 21/563 |
| | | | | 257/692 |
| 2011/0006415 | A1* | 1/2011 | Bachman | H01L 21/4867 |
| | | | | 257/737 |
| 2011/0026232 | A1* | 2/2011 | Lin | H01L 21/76898 |
| | | | | 361/760 |
| 2011/0155433 | A1* | 6/2011 | Funaya | H01L 23/49827 |
| | | | | 174/258 |
| 2011/0215469 | A1* | 9/2011 | Lo | H01L 21/2885 |
| | | | | 257/737 |
| 2011/0241218 | A1* | 10/2011 | Meyer | H01L 25/16 |
| | | | | 257/774 |
| 2011/0304058 | A1* | 12/2011 | Pendse | H05K 3/3436 |
| | | | | 257/778 |
| 2012/0061698 | A1 | 3/2012 | Toscano | |
| 2012/0125668 | A1* | 5/2012 | Chang | H01L 21/4853 |
| | | | | 174/257 |
| 2013/0037940 | A1* | 2/2013 | Chen | C23C 28/021 |
| | | | | 257/737 |
| 2013/0113099 | A1* | 5/2013 | Lim | H01L 24/97 |
| | | | | 257/738 |
| 2013/0168438 | A1 | 7/2013 | Lamprecht et al. | |
| 2013/0277813 | A1* | 10/2013 | Torwesten | H01L 23/3121 |
| | | | | 257/676 |
| 2013/0284499 | A1* | 10/2013 | Imafuji | H05K 3/00 |
| | | | | 174/250 |
| 2013/0334712 | A1* | 12/2013 | Meyer-Berg | H01L 21/561 |
| | | | | 257/783 |
| 2013/0341780 | A1* | 12/2013 | Scharf | H01L 24/24 |
| | | | | 257/677 |
| 2014/0001622 | A1* | 1/2014 | Bauer | H01L 23/3171 |
| | | | | 257/677 |
| 2014/0035127 | A1* | 2/2014 | Hirtreiter | H01L 21/283 |
| | | | | 257/737 |
| 2014/0036464 | A1* | 2/2014 | Kilger | H01L 23/49822 |
| | | | | 361/767 |
| 2014/0061902 | A1* | 3/2014 | Ramalingam | H01L 23/49816 |
| | | | | 257/738 |
| 2014/0177149 | A1* | 6/2014 | Ramalingam | H01L 24/29 |
| | | | | 361/679.02 |
| 2014/0182912 | A1* | 7/2014 | Lin | H01L 23/49811 |
| | | | | 174/261 |
| 2014/0183746 | A1 | 7/2014 | Lin et al. | |
| 2014/0374149 | A1 | 12/2014 | Sanada et al. | |
| 2015/0083213 | A1* | 3/2015 | Hardin | H01L 31/02242 |
| | | | | 136/256 |
| 2015/0091179 | A1* | 4/2015 | Shenoy | H01L 23/481 |
| | | | | 257/774 |
| 2015/0115440 | A1* | 4/2015 | Higuchi | H01L 24/05 |
| | | | | 257/737 |
| 2015/0194362 | A1 | 7/2015 | Otremba et al. | |
| 2016/0027746 | A1* | 1/2016 | Kramp | H01L 24/03 |
| | | | | 257/751 |
| 2016/0148861 | A1* | 5/2016 | Liang | H01L 23/49517 |
| | | | | 257/676 |
| 2016/0324002 | A1* | 11/2016 | Tazarine | H05K 1/0209 |
| 2017/0162555 | A1* | 6/2017 | Jo | B23K 35/262 |
| 2018/0233470 | A1* | 8/2018 | Killer | H01L 24/11 |

OTHER PUBLICATIONS

Corrosion in Control Systems Decrease the Lifetime of the Electronic Devices; Publication: Jun. 2013: Author: Gustavo Lopez Badilla.

* cited by examiner

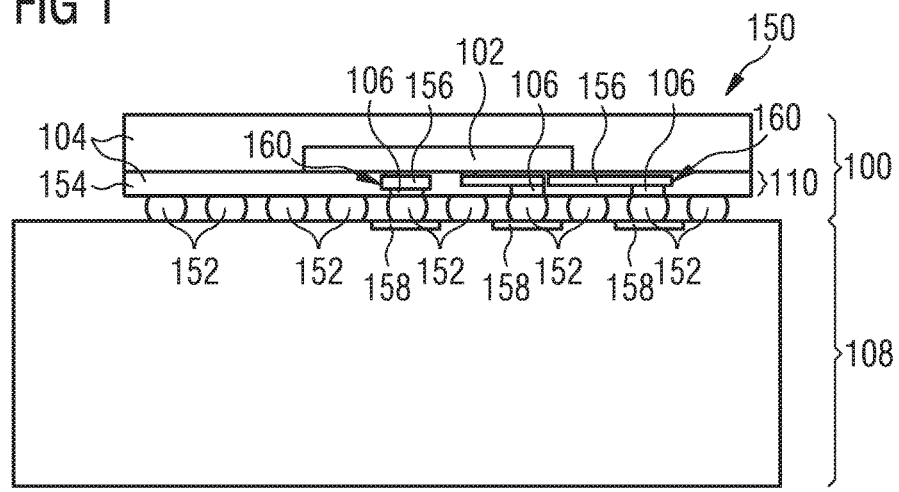
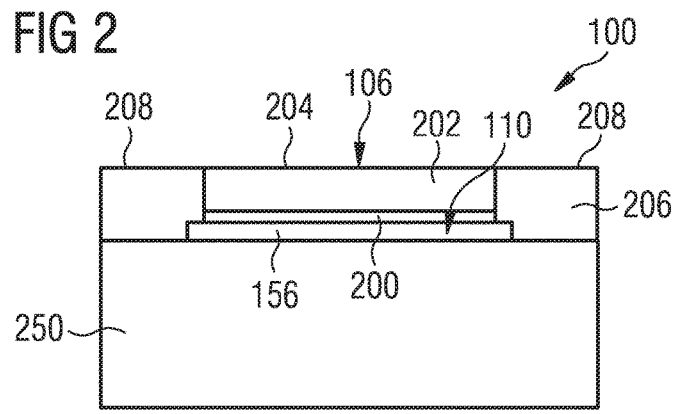
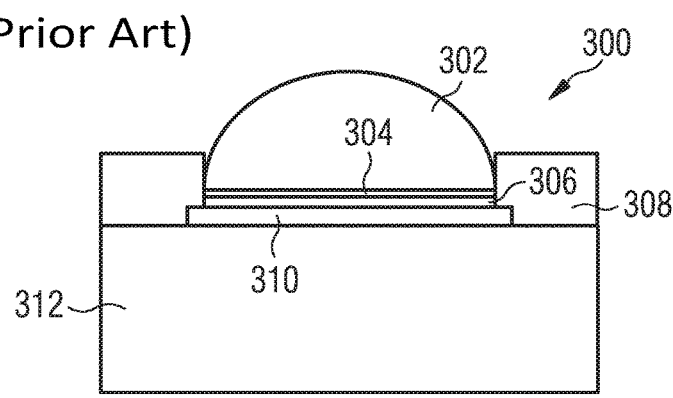

CHIP EMBEDDING PACKAGE WITH SOLDERABLE ELECTRIC CONTACT

BACKGROUND OF THE INVENTION

Field of the Invention

The present invention relates to packages, an arrangement, a preform of multiple packages, and a method of manufacturing a package.

Description of the Related Art

Packages may be denoted as encapsulated electronic chips with electrical connects extending out of the encapsulant and being mounted to an electronic periphery, for instance on a printed circuit board. The package may be connected to the printed circuit board by soldering. For this purpose, solder bumps may be provided at an exterior surface of the package which are to be connected to the printed circuit board.

Packaging cost is an important driver for the industry.

Related with this are performance, dimensions and reliability. The different packaging solutions are manifold and have to address the needs of the application. There are applications, where high performance is required, others, where reliability is the top priority—but all requires lowest possible cost.

SUMMARY OF THE INVENTION

There may be a need to manufacture packages with a provision for a simple and reliable solder connection with an electronic periphery.

According to an exemplary embodiment, a package is provided which comprises an electronic chip, a laminate-type encapsulant at least partially encapsulating the electronic chip, a wiring structure extending from the electronic chip up to a contact pad, and a completely galvanically formed solderable exterior electric contact electrically coupled with the electronic chip by being arranged (preferably, but not necessarily directly) on the contact pad.

According to another exemplary embodiment, a package is provided which comprises an electronic chip, a laminate-type encapsulant at least partially encapsulating the electronic chip, and a solderable exterior electric contact electrically coupled with the electronic chip, comprising a first galvanically formed layer directly on a second galvanically formed layer, and having a substantially flat exterior surface.

According to still another exemplary embodiment, an arrangement is provided which comprises a package having the above mentioned features, and a mounting base (for instance a printed circuit board, PCB) comprising a solder pad, wherein the package is mounted on the mounting base by a solder connection between the solderable exterior electric contact and the solder pad.

According to yet another exemplary embodiment, an integral preform of multiples package is provided which comprises a plurality of integrally connected packages having the above mentioned features, and an electric connection structure electrically connecting the electric contacts of at least two (in particular of all) of the packages and being arranged so that the electric connection structure is separated into different disconnected sections upon singularizing the preform into a plurality of separate packages.

According to still another exemplary embodiment, a method of manufacturing a package is provided, wherein the method comprises at least partially encapsulating an electronic chip by an encapsulant (in particular and preferably a laminate-type encapsulant, or a mold-type encapsulant), forming a wiring structure extending from the electronic chip up to a contact pad, and galvanically forming a layer (such as a single layer or a double layer, i.e. consisting of or comprising two stacked galvanically formed layers) as a solderable exterior electric contact electrically coupled with the electronic chip by being arranged in contact with the contact pad.

According to an exemplary embodiment of the invention, a solderable exterior electric contact of a package with a laminate-type encapsulant is formed by a galvanic deposition, in particular exclusively by a galvanic deposition. In contrast to conventional approaches in which re-melting of a conventional solder bump may form an uncontrolled intermetallic layer, formation of the electric contact by a galvanic deposition enables the formation of a multi-layer electric contact with one or more distinct borders between different metals. An uncontrolled formation of undefined phases may hence be suppressed. This yields a high reproducibility of the electric contact formed by galvanic deposition. Cavities which may conventionally occur in a surface portion (for example in a solder resist surface) of a laminate-type package may therefore be filled with galvanically deposited metallic or alloy material so that an undesired pronounced topography or surface contours or profiles in a surface portion of the package can be reliably prevented while simultaneously forming a solderable exterior electric contact with low manufacturing effort. Such a conventionally occurring surface topography may cause reliability issues. By preventing such a surface topography according to exemplary embodiments of the invention, controllability and reliability of the manufactured package may be improved.

Furthermore, it has turned out to be advantageous to provide an electric connection structure electrically connecting several or preferably all of the mentioned electric contacts of a batch of still integrally connected packages to be manufactured simultaneously. In the presence of such an electric connection, a galvanic deposition procedure for forming at least part of the electric contacts can be carried out highly efficiently, since it is then sufficient to apply a single common electric potential to the several or preferably all electric contacts for growing the galvanically formed electric contacts in a galvanic bath or the like.

The formation of a solderable exterior electric contact as a double layer of two parallel planar directly connected galvanically formed layers allows the manufacture of the electric contact with low effort and low cost. Expensive and chemically delicate materials of the electric contacts can therefore be avoided. The formation of a solderable exterior electric contact with a flat, substantially non-curved external surface provides a planar solderable exterior electric contact with a layer shape of sufficient thickness, which can be manufactured with a small amount of required material, and which can be fabricated with properly available and cheap material. Furthermore, an electric contact with planar exterior surface allows to properly monitor and inspect quality of a solder connection with a mounting base.

DESCRIPTION OF FURTHER EXEMPLARY EMBODIMENTS

In the following, further exemplary embodiments of the packages, the arrangement, the preform, and the method of manufacturing the package will be explained.

In the context of the present application, the term "package" may particularly denote at least one at least partially encapsulated electronic chip with at least one external electric contact. The electronic chip may be a semiconductor chip having at least one integrated circuit element (such as a diode or a transistor) in a surface portion thereof. The electronic chip may be a naked die or may be already packaged or encapsulated.

In the context of the present application, the term "laminate-type encapsulant" may particularly denote a substantially electrically insulating and preferably thermally conductive material at least partially surrounding (preferably hermetically surrounding) a semiconductor chip or the like in order to provide mechanical protection, electrical installation, and optionally a contribution to heat removal during operation. Such a laminate-type encapsulant can be provided of several layers connected to one another by applying a pressure at an elevated temperature. Thereby, the layers are interconnected to one another so that the laminate-type encapsulant is formed. For instance, a laminate-type encapsulant may comprise resin, in particular in combination with fibers, for instance FR4 or prepreg.

In the context of the present application, the term "galvanically formed" or "galvanically deposited" or "electroplated" may particularly denote a surface covering or coating of an electrically conductive material (such as a metal) being deposited on an at least partially electrically conductive surface (in particular on copper). Electroplating may be in particular denoted as a process that uses electric current to reduce dissolved metal cations so that they form a metal coating on an electrically conductive body. A process used in electroplating is electrodeposition. For electroplating of metals, water based solutions (electrolytes) may be used which contain the metals to be deposited as ions (i.e. dissolved metal salts). An electric field between the anode and the work piece as the cathode forces the positively charged metal ions to move to the cathode where they give up their charge and deposit themselves as metal on the surface of the work piece. Depending on the material to be deposited, different electrolytic bath solutions may be used.

In the context of the present application, the term "substantially flat upper surface" may particularly denote that the electric contact does not show a pronounced profile or curvature (such as a conventional semi-spherical bump). Although the upper surface not necessarily needs to be completely flat or even, its tendency of being convex or concave is significantly lower than that of a semi-spherical bump. In one embodiment, the substantially flat upper surface of the electric contact may be a non-curved flat upper surface.

In an embodiment, galvanically forming at least part of an electric contact, preferably the entire electric contact, comprises a galvanic plating procedure. Thus, the electric contact may be partly or completely formed by electroplating. This results in a simply manufacturable and reliable package.

In an embodiment, the electric contact comprises (in particular only) nickel and tin. In particular, the solderable exterior electric contact may comprise the tin layer (for example having a thickness in a range between 2 µm and 20 µm, for example 10 µm) on a nickel layer (for example having a thickness in a range between 1 µm and 8 µm, for example 5 µm). In particular, the thickness of the tin layer may be larger than the thickness of the nickel layer so that the double layer is sufficiently thin while simultaneously providing a sufficient depot of solderable material. Tin has highly advantageous soldering properties, is cheap and easily available and can be deposited galvanically in sufficient thickness. Also nickel is plateable by a galvanic deposition, is cheap and easily available and is chemically properly compatible both with tin and with copper (which is a preferred material for a contact pad as an end section of a wiring structure extending from an embedded electronic chip towards a surface of the package). Therefore, nickel is chemically highly appropriate for bridging between solderable material (such as tin) and contact pad material (such as copper) of a laminate-type encapsulant.

Alternatively, the electric contact comprises a combination of nickel and a lead-tin alloy, or a combination of nickel and gold, nickel and phosphor, tin and silver, only tin, or only nickel. In all these constellations, it is preferred that nickel forms a buried structure (in particular layer) for contacting a contact pad, and the respectively other material forms a surface solder structure (in particular layer) of an electric contact.

In an embodiment, the electric contact is formed as a layer stack composed of at least (in particular consisting of) an inner or interior layer (preferably comprising or consisting of nickel) and an outer or exterior layer (preferably comprising or consisting of tin). The outer layer can be active during soldering and is therefore preferably made of properly solderable material. The inner layer may serve as an interface towards an interior of the package, in particular towards electrically conductive copper structures.

In an embodiment, the outer layer comprises or consists of one of the group consisting of tin, tin and lead, and tin and silver. In an embodiment, the inner layer comprises or consists of one of the group consisting of nickel, and nickel and phosphor.

In an embodiment, the electric contact has an overall layer thickness in a range between 1 µm and 30 µm, in particular in a range between 5 µm and 25 µm. Such high thicknesses, which can be fabricated by a galvanic deposition procedure or electroplating, are highly preferred to ensure that sufficient solderable material is present.

In an embodiment, the upper first galvanically formed layer is configured as a soldering depot. In other words, the material of the first galvanically formed layer may be specifically configured for being solderable to thereby establish a solder connection with a mounting base. This can be accomplished with high quality and reliability by configuring the first galvanically formed layer as a galvanically formed tin layer.

In an embodiment, the second galvanically formed layer is configured as a connection promoting interface layer. In other words, the material of the second galvanically formed layer may be specifically configured for providing a reliable connection and chemical compatibility with the material of the first galvanically formed layer (in particular tin) on one main surface, and for providing a reliable connection and chemical compatibility with the material of the contact pads (in particular copper) on the other main surface. This can be accomplished with high quality and reliability by configuring the second galvanically formed layer as a galvanically formed nickel layer. A further function of the second galvanically formed layer may be that of a spacer preventing direct contact between contact pad (for instance made of copper) and solderable first galvanically formed layer (for instance made of tin).

In an embodiment, the package further comprises a redistribution layer between the encapsulated electronic chip and the electric contact. The redistribution layer may include at least part of the above-mentioned wiring structure with its contact pad(s). A patterned electrically conductive structure, embedded in a dielectric medium, may hence serve as a redistribution layer and may translate signals between the tiny dimensions of one or more pads of the electronic chip and the larger dimensions of external solder pads of a PCB or the like. In other words, the small dimensions of the chip world are transferred by the redistribution layer into the larger dimensions of the world of a mounting base such as printed circuit boards on which the electronic component or package may be mounted.

In an embodiment, copper material (in particular of the contact pad) of the redistribution layer is in direct contact with nickel material of the electric contact. Correspondingly, the method may comprise galvanically forming the exterior electric contact (in particular a nickel structure thereof) directly on a copper structure. This pair of materials is chemically highly compatible and simple in manufacture.

In an embodiment, a tin layer of the electric contact is a galvanically formed tin layer. Correspondingly, a nickel layer of the electric contact may be a galvanically formed nickel layer. Correspondingly, the method may comprise galvanically forming the exterior electric contact by galvanically forming a nickel structure followed by galvanically forming a tin structure. Preferably, the nickel layer has a planar exterior surface facing towards an interior of the package. Also preferably, the tin layer has a planar exterior surface facing towards an exterior of the package. Such a material combination may prevent an undesired pronounced topography, may be simple and cheap in manufacture and provides a proper solderability.

In an embodiment, the package further comprises a solder resist (in particular configured as a patterned layer) at an exterior surface of the package, wherein the electric contact flushes with or vertically extends beyond the electric contact at the exterior surface. This prevents an undesired negative standoff of the solderable electric contact which may cause quality problems with a solder connection. Such a solder resist may be a patterned electrically insulating structure (in particular layer) at a surface of a package with one or more recesses at the position of one or more electric contacts. A solder resist may be made of a material having electrically insulating properties and showing poor wettability with regard to solder material. For example, a solder resist may comprise epoxy material with filler particles promoting the above described properties.

In an embodiment, the electric connection structure of the preform is provided by a common chip carrier (in particular a common leadframe) assigned to some or all of the still integrally connected packages, or by a (preferably buried) sacrificial electric connection structure to be at least partially removed or at least separated upon singularizing the preform into the individual packages. Correspondingly, the method may comprise electrically connecting multiple electric contacts to one another, in particular via an electric connection structure, during the galvanic formation. The method may further comprise separating the electric connection structure into at least two different sections after the galvanic formation, in particular during singularization of the package and at least one further package. Thus, several or preferably all packages may be short-circuited by an electrically conductive structure (for instance a metallic layer or metallic leads interconnecting the packages) so that galvanic plating can be carried out with a single electric signal source to which all pads or electric contacts to be formed are electrically connected. All contact pads which shall be plated may therefore be electrically connected due to the process flow at the intended plating time. Preferably, such an electrical connection structure may be located in an interior of the preform or the packages (for instance directly beneath a solder resist) so as to prevent undesired deposition of electrically conductive material on the sacrificial electric connection structure during electroplating. Such an undesired deposition of electrically conductive material may have a negative impact on controllability and reliability of the manufactured packages. However, in a scenario in which such a parasitic deposition is not an issue or in which the sacrificial electric connection structure is removed after the galvanic deposition (for instance by etching), the sacrificial electric connection structure may also be located on an exterior surface of the preform and hence of the packages to be manufactured. In any case, it is possible to disconnect the packages after electroplating by singularization which automatically results in a disconnection of the package related sections of the sacrificial electric connection structure. Alternatively, disconnection may be carried out by a separate lithography procedure.

Hence, in one preferred embodiment, a common leadframe of a plurality of packages (prior to singularization) may be implemented as electric connection structure between the various packages. When electrically connecting such a common leadframe with the various electric contacts under fabrication (or preforms thereof), it is sufficient to apply only one electric signal to this leadframe for promoting galvanic deposition of the electric contacts of all packages in a galvanic bath.

For instance if such a common chip carrier is not present, a sacrificial electric connection structure may be formed to electrically connect the various electric contacts (or preforms thereof), thereby again rendering the application of only a single common electric signal during the galvanic formation of the electric contacts sufficient. By arranging the sacrificial electric connection structure in an interior of the preform, i.e. buried therein, it can be advantageously prevented that an electrically conductive material is undesirably deposited on the electric connection structure (which could cause reliability issues). The sacrificial connection structure may be located selectively in such regions of the preform which will be separated anyway (for instance cut) during singularization of the preform into the individual packages. Thus, any undesired influence of the sacrificial electric connection structure during operation of the individual packages may be prevented.

In an embodiment, an amount of galvanically deposited material of the exterior electric contact is selected so as to fill up a cavity in a surface of the package (in particular in a solder resist) so that a planar exterior surface of the electric contact is in flush with (i.e. is at the same height level) or vertically extends beyond (i.e. is at a higher height level) a planar exterior surface of the package (in particular of the solder resist). Thus, any negative standoff of the electric contacts may be prevented which might cause issues during subsequent soldering. The plating may hence also act to fill up a negative stand-off, for instance in a solder mask opening (non-pad-defined). Therefore, in particular tin (Sn) may be plated to at least almost fill the cavities. Alternatively, a substitute solder bump may be a Sn-layer with adjustable thickness (in particular on a nickel (Ni) layer) to fill up the cavities (for instance solder resist cavities).

Preferably, the method further comprises simultaneously galvanically forming at least one further solderable exterior electric contact of the package. In other words, multiple electric contacts of one package may be formed at the same time, at least partly by a galvanic deposition. Such a manufacturing procedure is highly efficient and fast.

In an embodiment, the method further comprises simultaneously galvanically forming at least one further solderable exterior electric contact of at least one further package. In other words, electric contacts of different packages may be formed at the same time, at least partly by a galvanic deposition. Hence, the described galvanic deposition architecture is compatible with a batch manufacture of multiple packages at the same time, thereby rendering the described manufacture of electric contacts particularly appropriate for high throughput applications.

In an embodiment, the encapsulant of the package comprises a laminate (rather than a mold compound formed by compression molding or transfer molding), in particular a printed circuit board laminate. In the context of the present application, the term "laminate structure" may particularly denote an integral flat member formed by electrically insulating structures which may be connected to one another by applying a pressing force. The connection by pressing may be optionally accompanied by the supply of thermal energy. Lamination may hence be denoted as the technique of manufacturing a composite material from multiple interconnected layers. A laminate can be permanently assembled by heat and/or pressure and/or welding and/or adhesives.

In an embodiment, the one or more electronic chips of a package is a/are power semiconductor chip(s). In particular for power semiconductor chips, electric reliability and heat removal capability are important issues which can be met with the described manufacturing procedure. Possible integrated circuit elements which can be monolithically integrated in such a semiconductor power chip are field effect transistors (such as insulated gate bipolar transistors or metal oxide semiconductor field effect transistors) diodes, etc. With such constituents, it is possible to provide packages for automotive applications, high-frequency applications, etc. Examples for electric circuits which can be constituted by such and other power semiconductor circuits and packages are half-bridges, full bridges, etc.

As substrate or wafer for the semiconductor chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 1 illustrates a cross-section of an arrangement according to an exemplary embodiment composed of a package with embedded electronic chip and of a mounting base which is electrically and mechanically connected to the package by soldering.

FIG. 2 illustrates a cross-sectional of a portion of a package according to a preferred embodiment.

FIG. 3 illustrates a cross-sectional of a portion of a conventional package.

DETAILED DESCRIPTION OF EXEMPLARY EMBODIMENTS

Figure 4:
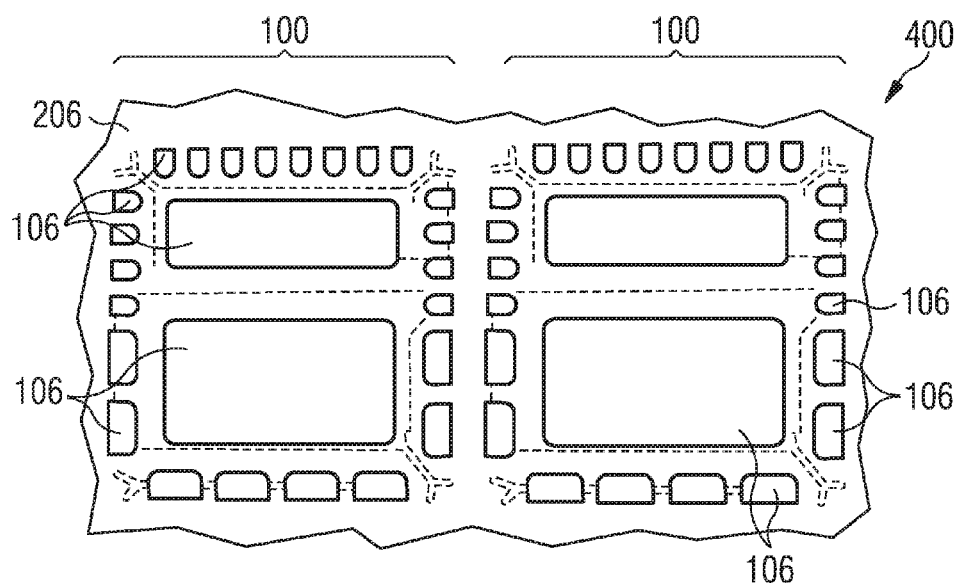
FIG. 4 illustrates a plan view of a package preform according to an exemplary embodiment.

The illustration in the drawing is schematically and not to scale.

Before exemplary embodiments will be described in more detail referring to the figures, some general considerations will be summarized based on which exemplary embodiments have been developed.

According to an exemplary embodiment of the invention, a galvanic NiSn structure is provided as final surface of a chip embedding package fabricated in laminate technology. In particular, a conventional solder bump of the package may be substituted by a galvanically plated layer structure.

For mounting a package on a mounting base such as a printed circuit board, a solderable surface on a copper layer for chip embedding packages would be desirable. For devices with solder resist, the solder resist cavities should be filled up with a solderable material to avoid a negative standoff which might lead to difficulties in second level soldering.

For packages without solder resist, an expensive electroless NiAu plating is conventionally applied. This process is challenging to control, may involve yield loss, and may need expensive chemicals and gold.

For conventional devices with solder resist, the solder resist openings are plated with electroless NiAu and afterwards a solder bump is generated by melting a printed solder paste depot, which leads to a positive standoff. The shape of the bumps can however lead to contact failures at electrical testing. Moreover, fluctuations in the printing process may lead to yield loss at the expensive bump height process control.

According to one exemplary embodiment of the invention, a cost efficient replacement of conventional expensive electroless NiAu surface by a galvanic NiSn surface can be carried out.

According to another exemplary embodiment of the invention, it is possible to substitute solder bumps by an adjustable Sn-layer thickness (on Ni-Layer) to fill up solder resist cavities.

According to still another exemplary embodiment of the invention, a chip embedding package is provided with galvanic plating, preferably Ni/Sn. This can be realized differently in different exemplary embodiments of the invention, such as:

a) In one embodiment, all pads, which have to be plated, are electrically connected due to the process flow at the intended plating time, and plating can be done without extra effort.

b) In one embodiment, an additional connection is applied to simplify galvanic deposition, wherein the additional connection may be afterwards removed during separation of the packages.

c) In an embodiment, it is also possible to provide an electrical connection, which can be removed by an extra lithography step.

d) In an embodiment, the plating may also act to fill up a negative stand-off, for instance in a solder mask opening (non-pad-defined). Therefore, Sn may be plated to at least almost fill the cavities.

FIG. 1 illustrates a cross-section of an arrangement 150 according to an exemplary embodiment of the invention composed of a package 100 with an embedded electronic chip 102 (wherein other embodiments may embed a plurality of electronic chips 102) and of a mounting base 108 which is electrically and mechanically connected to the package 100 by soldering.

More specifically, the arrangement 150 comprises the package 100 which is here embodied as semiconductor power package. Consequently, the electronic chip 102 can be a power semiconductor chip (for instance having integrated therein one or more diodes, one or more transistors such as IGBTs, etc.). In the shown embodiment, the mounting base 108 may be embodied as a printed circuit board, PCB) comprising solder pad 158. As shown, the package 100 is mounted on the mounting base 108 by establishing a solder connection between solderable exterior electric contacts 106 of the package 100 on the one hand and the solder pads 158 of the mounting base 108 on the other hand.

FIG. 1 shows optional solderable structures 152 (such as solder paste) between the electric contacts 106 and the solder pads 158 as additional solder depot. However, the solderable structures 152 may also be omitted in other embodiments in which a direct solder connection is formed between the electric contacts 106 and the solder pads 158.

Formation of a solder connection between the package 100 and the mounting base 108 may for instance be accomplished by placing the package 100 on the mounting base 108 so that the electric contacts 106 and the solder pads 158 are aligned and by subsequently supplying thermal energy (for instance in a solder oven).

The package 100 embeds or encapsulates the electronic chip 102 in a laminate-type encapsulant 104. The laminate-type encapsulant 104 may be composed of a plurality of electrically insulating layers (for instance made of prepreg or FR4), which may be interconnected by lamination (for instance by applying pressure at an elevated temperature). The above-mentioned galvanically formed solderable exterior electric contacts 106 at an exterior surface of the package 100 are electrically coupled with the electronic chip 102 via a redistribution layer 110. More specifically, a wiring structure 160 (for instance composed of several interconnected electrically conductive elements, in particular made of copper) may be provided which extends from the electronic chip 102 up to a contact pad 156 of the wiring structure 160. The various contact pads 156 shown in FIG. 1 may be flat metallic structures such as planar copper areas. The redistribution layer 110 may be composed of one or more electrically insulating layers 154 with integrated electrically conductive traces of the wiring structure 160 (for instance made of copper material) for translating between the small dimensions of chip pads and the larger dimensions of the solder pads 158 of the mounting base 108. The contact pads 156 as exterior end sections of the wiring structure 160 of copper directly contact a package-internal surface of the electric contacts 106. For forming the electric contacts 106 on the contact pads 156, one or several galvanic plating procedures (each relating to an assigned material of the layer-type electric contacts 106) may be carried out.

Preferably, the electric contact 106 comprises a galvanically fabricated double layer composed of a package-internal nickel layer in direct contact with a respective one of the contact pads 156 on one main surface and with a package-external tin layer directly on the opposing other main surface of the nickel layer, as described in further detail referring to FIG. 2. Such an electric contact 106 may be in flush with adjacent surface portions of the laminate type package 100 to thereby prevent a pronounced surface topography. This results in reliable packages 100. Furthermore, such a planar geometry simplifies inspection of the manufactured electric contacts 106 and its proper soldering with the mounting base 108. This increases reproducibility of the package 100 and hence improves reliability of the package 100. At the same time, a galvanic formation of the reliably available constituents of the electric contacts 106 allows for a simple, fast and cheap manufacture of the electric contacts 106. Moreover, the galvanic fabrication procedure ensures a sufficiently large thickness of the electric contacts 106 (in particular of the tin layer thereof), so that the amount of solderable material of the electric contacts 106 (contributing to the solder depot) is sufficiently high, thus ensuring a reliable solder connection with the mounting base 108.

FIG. 2 illustrates a cross-sectional of a portion of a package 100 according to a preferred embodiment of the invention with an electric contact 106 as final surface of the chip embedding package 100 fabricated in laminate technology. In FIG. 2, reference numeral 250 schematically shows a core portion of the package 100 which can be configured depending on a desired package technology or application. For instance, the core portion 250 may comprise at least part of at least one of reference numerals 102, 104, 110, 160 according to FIG. 1. In particular, a wiring structure 160 may be provided also according to FIG. 2 which may extend from the electronic chip 102 through the encapsulant 104 up to the contact pad 156 shown in FIG. 2.

The package 100 shown in FIG. 2 further comprises an electrically insulating solder resist 206 at an exterior surface of the package 100, wherein the material of the optional solder resist 206 is selected so as to be substantially non-wettable by solder material. For example, a filled epoxy material may be used as solder resist 206. As can be seen in FIG. 2, an externally planar surface 208 of the solder resist 206 substantially flushes (without the formation of steps or another surface contour or profile) with an externally planar surface 204 of the electric contact 106. This suppresses an undesired formation of a pronounced surface topography. Thus, a cavity of the solder resist 206 may be filled up galvanically with solderable material. While a negative standoff and therefore a remaining cavity between the solder resist 206 and the electric contacts 106 should be prevented to avoid problems of second-level soldering, it is alternatively to FIG. 2 possible that the externally planar surface 204 of the electric contact 106 vertically protrudes beyond the externally planar surface 208 of the solder resist 206.

The electric contact 106 according to FIG. 2 is composed of an exterior galvanically formed tin layer 202 (for instance having a thickness of 10 μm in a vertical direction according to FIG. 2) with a flat upper surface arranged directly on a galvanically formed interior nickel layer 200 (for instance having a thickness of 5 μm in the vertical direction according to FIG. 2). The nickel layer 200 is, in turn, arranged directly on an exterior copper surface of a contact pad 156 of the electrically conductive traces of the wiring structure 160 of the redistribution layer 110. The copper material of the electrically conductive traces of the wiring structure 160 of the redistribution layer 110 is hence in direct contact with nickel material of the electric contact 106 to thereby prevent a direct contact between the tin layer 202 and the copper material of the contact pad 156. The solderable tin layer 202 may accomplish the solder connection with a mounting base 108. Advantageously, the tin layer 202 has the planar exterior surface 204. The galvanic nickel layer 200 is simple and cheap in manufacture, can be fabricated in a reproducible manner, is properly solderable, and is chemically stable during the manufacturing process and over the lifetime of the package 100.

FIG. 3 illustrates a cross-sectional of a portion of a conventional laminate embedding package 300. A core portion 312 of the package 300 may be covered by a copper pad 310 surrounded by a protruding solder resist 308. On top of the copper pad 310, an electroless plated nickel layer 306, an electroless plated gold layer 304, and a solder bump 302 may be formed for establishing a solder connection with a PCB (not shown). For producing, the solder bump 302 must be re-melted with high effort. The bump 302 geometry renders it difficult to inspect its geometry. Moreover, this architecture creates a significant surface topography which may involve reliability issues of the package 300. The involved gold material, which shall promote wettability of solderable material, increases manufacturing complexity and costs. Moreover, the electroless nickel gold deposition chemistry introduces process instabilities, since it is not properly compatible with the material of the solder resist 308.

At least some of the mentioned and other shortcomings of the conventional package 300 may be overcome by exemplary embodiments of the invention, in particular by the package 100 shown in FIG. 2.

FIG. 4 illustrates a plan view of a package preform 400 according to an exemplary embodiment of the invention.

The integral preform 400 according to FIG. 4, which is an intermediate structure obtained during a batch manufacture of multiple packages 100, is composed of multiple still connected packages 100, two of which being shown in FIG. 4. Although not shown, each of the packages 100 comprises three electronic chips 102 according to FIG. 4. As although not shown, all pads and electric contacts 106 of all packages 100 of the integral preform 400 are electrically connected to one another by a buried common chip carrier of electrically conductive material such as copper. The leadframe may be located substantially parallel to and below the paper plane of FIG. 4. This simplifies the simultaneous formation of the electric contacts 106 of all packages 100 of the integral preform 400 by galvanic deposition, since a common electric current can be applied to the buried common leadframe for short circuiting the electric contacts 106 while the preform 400 is immersed in a galvanic bath. Thus, when manufacturing the preform 400 according to FIG. 4, the method simultaneously galvanically forms multiple solderable exterior electric contact 106 of a respective one of the packages 100, as well as multiple solderable exterior electric contacts 106 of the various packages 100. Thus, the galvanic deposition procedure is highly parallel, and hence quick and efficient.

Figure 5:
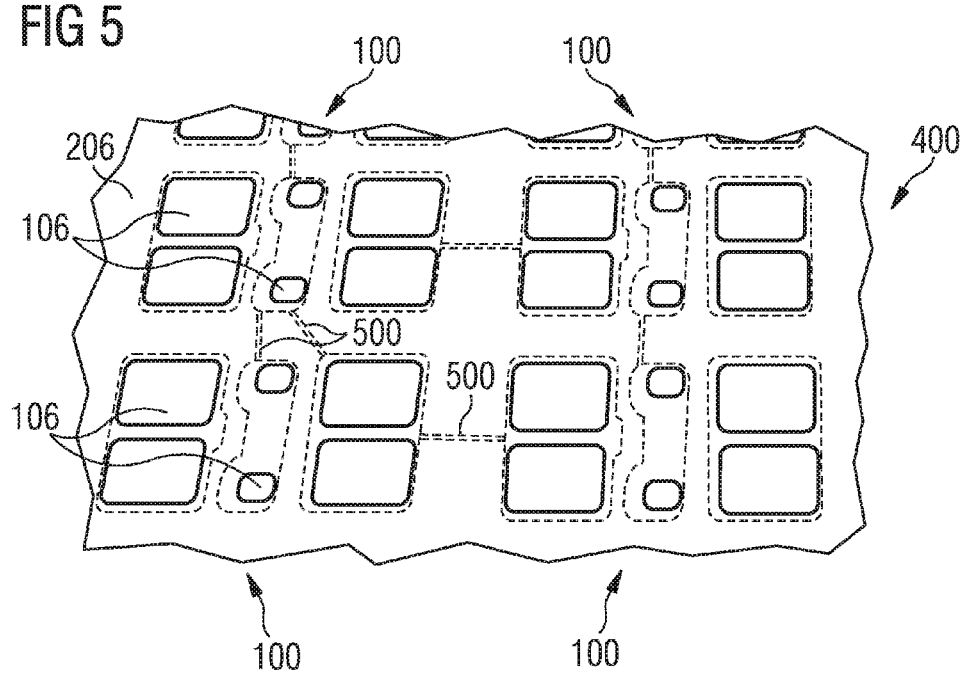
FIG. 5 illustrates a plan view of a package preform according to another exemplary embodiment.

FIG. 5 illustrates a plan view of a package preform 400 according to another exemplary embodiment.

According to FIG. 5, the various electric contacts 106 of the various packages 100 are not electrically connected to one another by a common leadframe. Hence, the function of the common leadframe short circuiting all electric contacts 106 during the galvanically forming procedure according to FIG. 4 is provided according to FIG. 5 by a buried electric connection structure 500 (which is visible in FIG. 5 as a number of webs interconnecting the electric contacts 106, preferably beneath the solder resist 206). The additional sacrificial electric connection structure 500 may be cut and hence disconnected electrically and mechanically during a dicing process of singularizing the packages 100.

Figure 6:
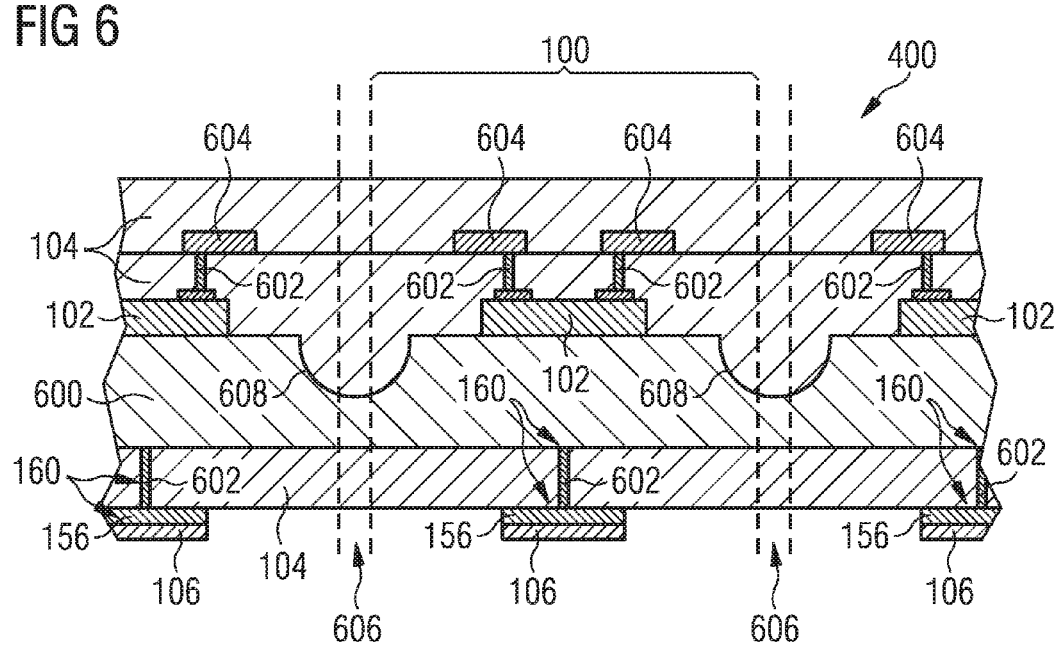
FIG. 6 illustrates a cross-sectional of a package preform according to another exemplary embodiment.

FIG. 6 illustrates a cross-sectional of a package preform 400 according to another exemplary embodiment.

According to FIG. 6, the electric connection structure for accomplishing galvanic formation of the electric contacts 106 by applying a single electric potential to all electric contacts 106 is provided by a common chip carrier 600, here embodied as a common leadframe, which can be later separated upon singularizing. For simplifying singularization after completion of the galvanic formation of the electric contacts 106 on the contact pads 156, the common chip carrier 600 has already been locally thinned in thinned regions 608 aligned with later separation lines 606 (where the preform 400 can be sawn for singularizing the packages 100). Multiple electrically conductive vertical interconnections 602 (embodied as vias, in particular copper vias) extend vertically through the individual dielectric layers (of prepreg or FR4) constituting the laminate-type encapsulant 104 and electrically couple the electric contacts 106 with the common chip carrier 600. Additional metallic pads 604, for instance portions of a patterned metal foil (such as a copper foil), are shown as well in FIG. 6.

According to FIG. 6, the electric contacts 106 may be formed as double layers 200, 202 of nickel and tin (as in FIG. 2), wherein these two layers 200, 202 may be galvanically deposited one after the other on electrically conductive traces of the wiring structure 160, more precisely on exposed surface portions of the electrically conductive contact pads 156 (for instance copper pads) thereof.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:
1. A package, comprising:
an electronic chip;
a laminate-type encapsulant at least partially encapsulating the electronic chip;
a wiring structure extending from the electronic chip up to a contact pad made of copper;
a completely galvanically formed solderable exterior electric contact electrically coupled with the electronic chip by being arranged directly on the contact pad,
wherein the electric contact comprises or consists of one of the group consisting of nickel and tin, nickel and lead-tin, nickel and gold, nickel and phosphor, and only nickel
an electrically insulating solder resist,
wherein the solder resist is formed on a core portion comprising at least the wiring structure,
wherein the solder resist comprises a cavity,
wherein the contact pad is formed inside the cavity in connection with the wiring structure,
wherein the solderable exterior electric contact is filled up galvanically in the cavity for at least flushing an externally planar surface of the electric contact with an external planar surface of the solder resist and wherein the completely galvanically formed solderable exterior electric contact is arranged directly on the contact pad within the cavity.

2. The package according to claim 1, wherein the electric contact is formed as a layer stack composed of at least, in particular consisting of, an inner layer and an outer layer.

3. The package according to claim 2, wherein the outer layer comprises or consists of one of the group consisting of tin, tin and lead, and tin and silver.

4. The package according to claim 2, wherein the inner layer comprises or consists of one of the group consisting of nickel, and nickel and phosphor.

5. The package according to claim 1, wherein the electric contact has a thickness in a range between 1 μm and 30 μm, in particular in a range between 5 μm and 20 μm.

6. An arrangement, comprising
a package according to claim 1;
a mounting base comprising a solder pad;
wherein the package is mounted on the mounting base by a solder connection between the solderable exterior electric contact and the solder pad.

7. An integral preform, the preform comprising:
a plurality of integrally connected packages according to claim 1;
an electric connection structure electrically connecting the electric contacts of at least two of the packages and being arranged so that the electric connection structure is separated into different disconnected sections upon singularizing the preform into a plurality of separate packages.

8. The preform according to claim 7, wherein the electric connection structure is provided by one of the group consisting of a common chip carrier, and a buried sacrificial electric connection structure to be at least partially removed upon singularizing.

9. A package, comprising:
an electronic chip;
a laminate-type encapsulant at least partially encapsulating the electronic chip;
a solderable exterior electric contact electrically directly coupled by a contact pad made of copper with the electronic chip, comprising a first galvanically formed layer directly on a second galvanically formed layer, and having a substantially flat exterior surface,
wherein the electric contact comprises or consists of one of the group consisting of nickel and tin, nickel and lead-tin, nickel and gold, nickel and phosphor, and only nickel;
an electrically insulating solder resist,
wherein the solder resist is formed on a core portion comprising at least the wiring structure,
wherein the solder resist comprises a cavity,
wherein the contact pad is formed inside the cavity in connection with the wiring structure,
wherein the first galvanically formed layer and the second galvanically formed layer is filled up galvanically in the cavity for at least flushing an externally planar surface of the electric contact with an external planar surface of the solder resist and wherein the completely galvanically formed solderable exterior electric contact is arranged directly on the contact pad within the cavity.

10. The package according to claim 9, wherein the first galvanically formed layer is a galvanically formed tin layer.

11. The package according to claim 9, wherein the second galvanically formed layer is a galvanically formed nickel layer.

12. The package according to claim 9, wherein the electric contact vertically extends beyond the electric contact at the exterior surface.

13. A method of manufacturing a package, the method comprising:
at least partially encapsulating an electronic chip by an encapsulant;
forming a wiring structure extending from the electronic chip up to a contact pad made of copper;
galvanically forming a layer as a solderable exterior electric contact electrically coupled with the electronic chip by being arranged directly in contact with the contact pad,
wherein the electric contact comprises or consists of one of the group consisting of nickel and tin, nickel and lead-tin, nickel and gold, nickel and phosphor, and only nickel;
forming an electrically insulating solder resist on a core portion comprising at least the wiring structure,
forming a cavity in the solder resist,
forming the contact pad inside the cavity in connection with the wiring structure,
filing up the solderable exterior electric contact galvanically in the cavity for at least flushing an externally planar surface of the electric contact with an external planar surface of the solder resist and wherein the completely galvanically formed solderable exterior electric contact is arranged directly on the contact pad within the cavity.

14. The method according to claim 13, wherein the layer is one of a single layer and a double layer.

15. The method according to claim 13, wherein an amount of material of the exterior electric contact is selected so as to fill up a cavity in the solder resist, so that a planar exterior surface of the electric contact vertically extends beyond a planar exterior surface of the solder resist.

16. The method according to claim 13, wherein the method comprises galvanically forming the exterior electric contact by galvanically forming a nickel layer followed by galvanically forming a tin layer on the nickel layer.

17. The method according to claim 13, wherein the method comprises galvanically forming the exterior electric contact on copper material of the contact pad.

18. The method according to claim 13, wherein the solderable exterior electric contact is galvanically formed with a substantially flat exterior surface.

19. The method according to claim 13, wherein the method further comprises simultaneously galvanically forming at least one further solderable exterior electric contact of the package.

20. The method according to claim 13, wherein the method further comprises simultaneously galvanically forming at least one further solderable exterior electric contact of at least one further package.

21. The method according to claim 19, wherein the method comprises electrically connecting the electric contact and the at least one further electric contact to one another, in particular via an electric connection structure, during the galvanically forming procedure.

22. The method according to claim 21, wherein the method comprises separating the electric connection structure into disconnected sections after the galvanically forming procedure.

* * * * *